(12) United States Patent
Hyeon

(10) Patent No.: US 6,188,289 B1
(45) Date of Patent: Feb. 13, 2001

(54) WIDE RANGE VOLTAGE CONTROLLED OSCILLATOR EMPLOYING TWO CURRENT UNITS

(75) Inventor: Yun-jong Hyeon, Shiheung (KR)

(73) Assignee: Samsung Electronics Co., Ltd., Kyungki-do (KR)

( * ) Notice: Under 35 U.S.C. 154(b), the term of this patent shall be extended for 0 days.

(21) Appl. No.: 09/339,376

(22) Filed: Jun. 24, 1999

(30) Foreign Application Priority Data

Aug. 17, 1998 (KR) .................................................. 98/33285

(51) Int. Cl.[7] .................. H03B 1/00; H03L 7/08; H03L 7/093; H03L 7/085
(52) U.S. Cl. .................. 331/17; 331/25; 331/34; 331/177 R; 331/179; 327/156
(58) Field of Search .................. 331/8, 10, 11, 331/14, 15, 17, 18, 25, DIG. 2, 177 R, 34, 179; 327/156–159; 375/376; 455/260

(56) References Cited

U.S. PATENT DOCUMENTS

| | | | |
|---|---|---|---|
| 3,882,412 | * 5/1975 | Apple, Jr. ............................. | 331/1 A |
| 4,562,410 | * 12/1985 | O'Rourke ............................. | 331/1 A |
| 4,568,888 | * 2/1986 | Kimura et al. ......................... | 331/10 |
| 5,091,921 | * 2/1992 | Minami ................................. | 375/88 |
| 5,382,922 | * 1/1995 | Gersbach et al. ..................... | 331/1 A |

* cited by examiner

Primary Examiner—David Mis
(74) Attorney, Agent, or Firm—Eugene M. Lee, Esq.; The Law Offices Of Eugene M. Lee, P.L.L.C.

(57) ABSTRACT

A wide range voltage controlled oscillator including a voltage-to-current conversion unit generating a control current responsive to a control voltage, and an offset current generation unit generating an offset current. The offset current generation unit is responsive to the control voltage and, at certain times, is responsive to a reference voltage. An adding unit adds the control current to the offset current, and generates an oscillation control current. An oscillation unit generates the oscillation signal responsive to the oscillation control current.

20 Claims, 3 Drawing Sheets

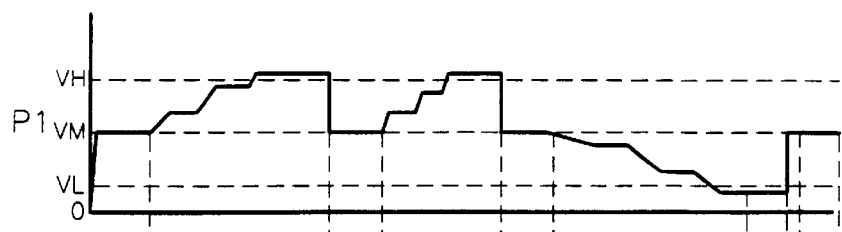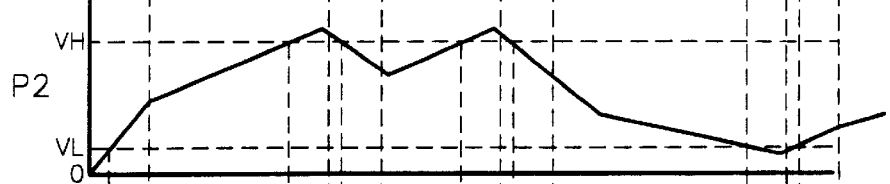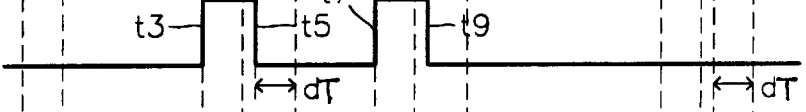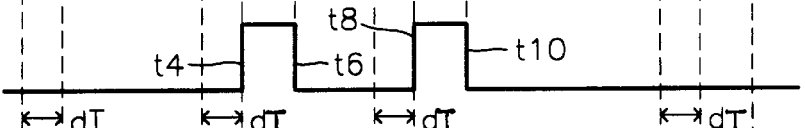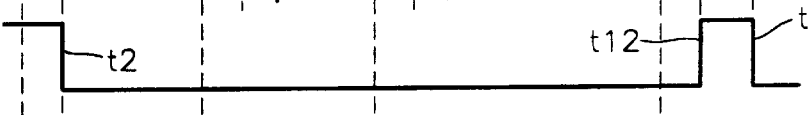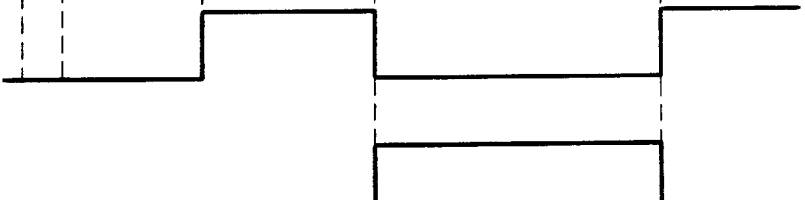

WIDE RANGE VOLTAGE CONTROLLED OSCILLATOR EMPLOYING TWO CURRENT UNITS

BACKGROUND OF THE INVENTION

1. Field of the Invention

The present invention relates generally to a method and apparatus for generating a stable oscillation signal over a wide frequency range and, more particularly, to a wide range voltage controlled oscillator and a phase locked loop using such an oscillator.

2. Description of the Related Art

A phase locked loop is a feedback circuit used to generate an output signal whose frequency tracks any variation in the frequency of an input signal. FIG. 1 shows a conventional phase locked loop circuit. In the phase locked loop of FIG. 1, a phase detector 2 detects a phase difference PD between an input reference signal and an oscillation signal output by a voltage controlled oscillator 6. The phase difference PD functions as an error feedback signal, varying with the difference in frequency between the input reference signal and the oscillation signal output. A low-pass filter 4 filters the phase difference signal PD and outputs a voltage control signal VC. The voltage controlled oscillator 6 receives the voltage control signal VC and generates an oscillation signal having a frequency which varies according to the oscillating control signal VC. The frequency of the oscillation signal output is determined by the magnitude of the voltage control signal VC, which in turn is determined by the magnitude of the phase difference PD. Thus, the frequency of the oscillation signal is adjusted according to the error between the input reference signal and the oscillation signal, resulting in the oscillation signal frequency tracking the input reference signal frequency.

This conventional type of phase locked loop has been used in many applications, such as an FM demodulator, a frequency synthesizer, a digital data recording and reproducing apparatus, etc. Different applications may require a phase locked loop in which the reference signal input to the phase detector has a frequency varying within a narrow frequency range or within a wide frequency range. In a phase locked loop which receives a reference signal having a wide frequency range (called a wide range phase locked loop), it is preferable that the sensitivity, and thus the gain, of the voltage control oscillator is very high.

However, when the gain of the voltage controlled oscillator is very high, the voltage controlled oscillator and the phase locked loop become sensitive to noise, and undesirable variations in the frequency of the oscillation signal occur, producing jitter. For example, a voltage controlled oscillator with an output range of 1 to 300 MHz which receives an input reference signal varying within a range of 3V has a gain of 100 MHz/V (or 100 kHz/mV). A voltage controlled oscillator having such a large gain becomes sensitive to noise, to such an extent that its jitter characteristics become a serious problem. The present invention is directed to overcoming or at least reducing the effects of this problem.

SUMMARY OF THE INVENTION

To solve the above problem, the present invention provides a voltage controlled oscillator having a small gain and thus a stable jitter property, while having a wide frequency range. The present invention also provides a phase locked loop which uses the voltage controlled oscillator to produce stable operation with a wide frequency range. In addition, the present invention provides a method for generating an oscillation signal which achieves the above benefits. The voltage controlled oscillator of the present invention has a greatly reduced gain, compared to a conventional oscillator having the same oscillation frequency range. Thus, the sensitivity with respect to noise is reduced and the jitter characteristics are improved.

Accordingly, as one aspect of the invention there is provided a voltage controlled oscillator having a voltage-to-current conversion unit for converting the control voltage into a control current, an offset current generation unit for generating an offset current which varies in response to changes in the control voltage, an adding unit for adding the control current to the offset current and generating an oscillation control current, and an oscillation unit for generating the oscillation signal having a frequency which varies with the oscillation control current.

In accordance with another aspect of the invention there is provided a phase locked loop having a phase detector for detecting a phase difference between an input reference signal and an oscillation signal, and outputting a phase difference signal, a filter for filtering the phase difference signal and outputting a control voltage, and a voltage controlled oscillator for generating an oscillation signal whose frequency varies with the control voltage. The voltage controlled oscillator has the same structure as described above.

In accordance with yet another aspect of the invention there is provided a method for generating a oscillation signal having a frequency varying in accordance with a control voltage, including the steps of converting the control voltage into a control current, generating an offset current which varies with the control voltage, adding the control current to the offset current to generate an oscillation control current, and generating the oscillation signal whose frequency varies according to the oscillation control current.

BRIEF DESCRIPTION OF THE DRAWINGS

The above features and advantages of the invention will become apparent upon reference to the following detailed description of specific embodiments and the attached drawings, of which:

FIGS. 4A through 4H show waveforms of signals indicated in FIG. 3; and

DESCRIPTION OF SPECIFIC EMBODIMENTS

Korean Application No. 98-33285, filed Aug. 17, 1998, discloses the same subject matter as the present application and is hereby incorporated by reference as if fully set forth herein.

Figure 2:
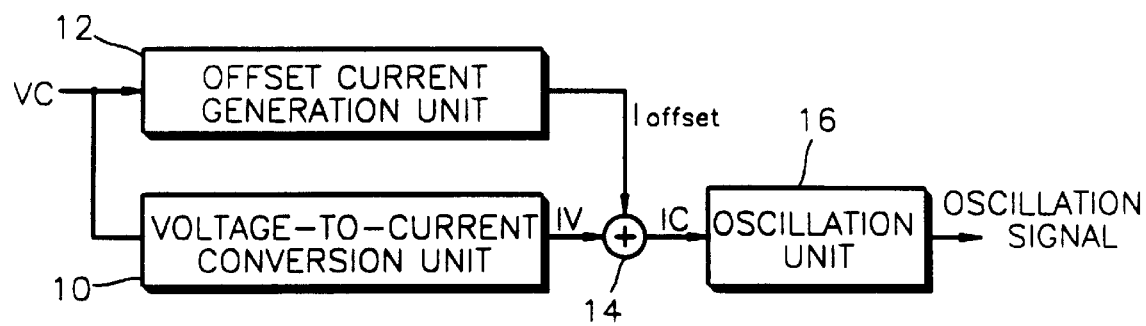
FIG. 2 is a block diagram of a voltage controlled oscillator according to the present invention.

Referring now to FIG. 2, a voltage controlled oscillator according to the present invention is shown, which includes a voltage-to-current converter 10, an offset current generator 12, an adder 14, and an oscillator 16. The voltage-to-current converter 10 receives a control voltage VC, converts the control voltage VC into a current, and outputs a control current IV. The offset current generator 12 generates and outputs an offset current $I_{offset}$ which varies with the control voltage VC. The adder 14 receives the control current IV and the offset current $I_{offset}$ adds them, and outputs the result as an oscillation control current IC. The oscillator 16 generates an oscillation signal whose frequency varies in proportion to the oscillation control current IC.

Figure 1:
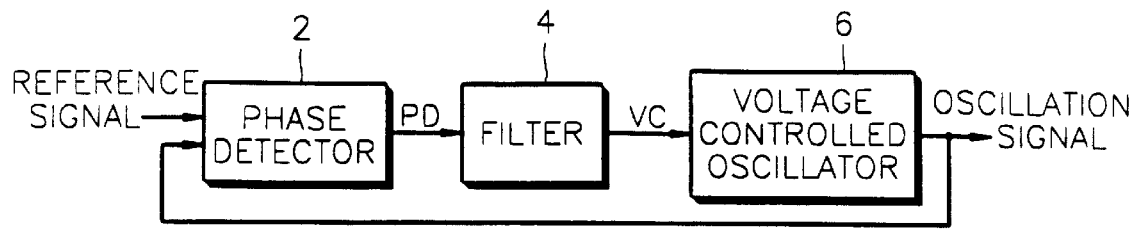
FIG. 1 is a block diagram of a conventional phase locked loop.

The voltage controlled oscillator of FIG. 2 may be used in place of conventional voltage controlled oscillator 6 in the phase locked loop shown in FIG. 1. In a phase locked loop, the voltage-to-current converter 10 receives the control voltage VC from a low-pass filter (shown in FIG. 1) of the phase locked loop, and converts the control voltage VC into a current as described above. Also, the offset current generator 12 generates the offset current $I_{offset}$ which varies with the control voltage VC from the low-pass filter.

Figure 3:
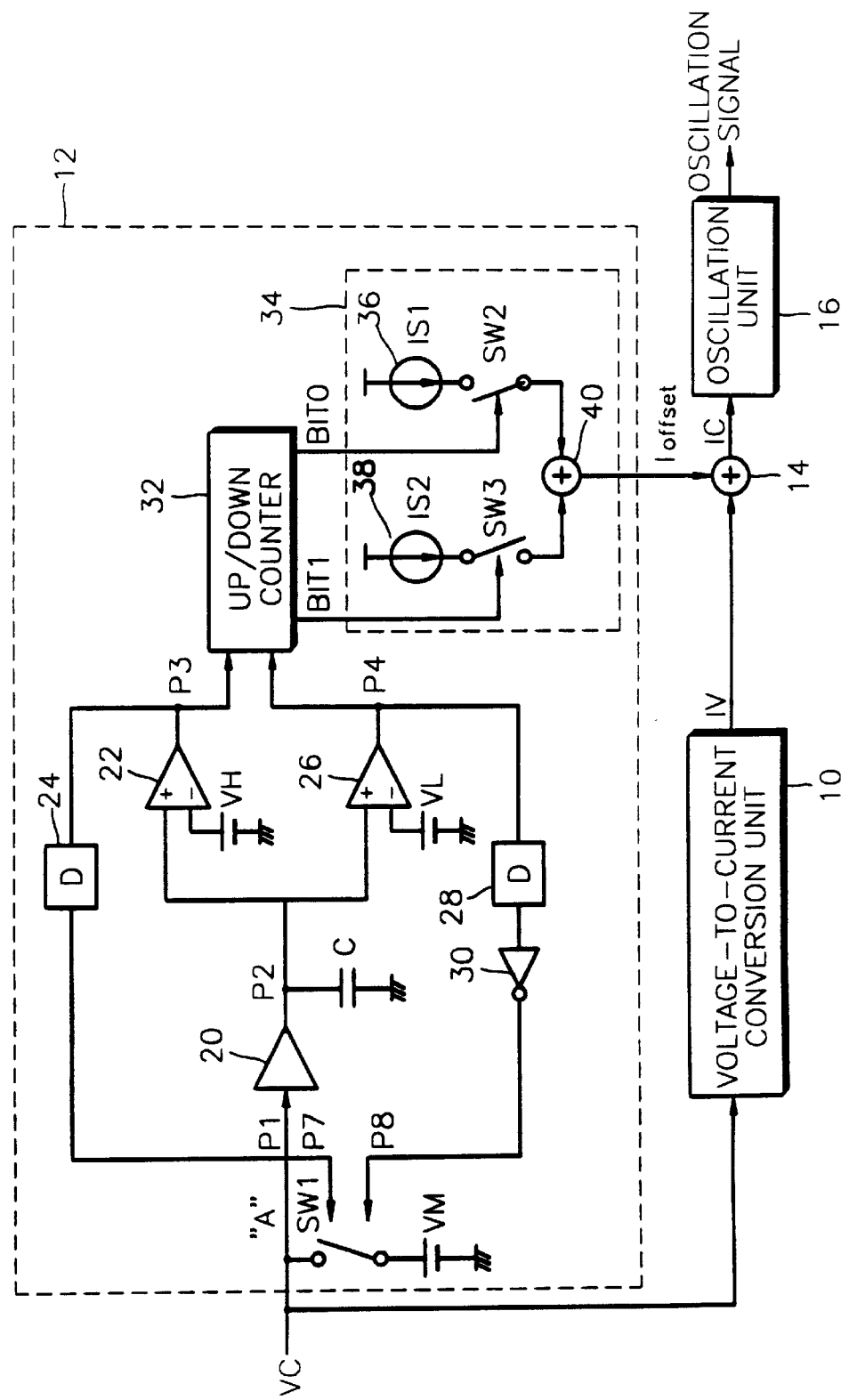
FIG. 3 is a detailed block diagram of a voltage controlled oscillator according to one embodiment of the present invention.

A preferred embodiment of the voltage controlled oscillator of the present invention is shown in more detail in FIG. 3. in the offset current generation unit 12, a switch SW1 has one port connected to an input node A, and a second port which receives a first reference voltage VM. The switch SW1 allows the first reference voltage VM to be applied to the input node A, in response to first and second switch control signals P7 and P8. When the first and second switch control signals P7 and P8 are both inactive, the switch SW1 is open to provide a control voltage VC to a buffer 20. However, when either the first or second switch control signal P7 or P8 is activated, the switch SW1 is closed to provide the first reference voltage VM to the buffer 20. The buffer 20 receives voltage P1 of node A, buffers the voltage P1, and outputs a current proportional to the voltage P1 to charge or discharge a capacitor C, producing voltage P2 across capacitor C.

A first comparator 22 receives voltage P2 through a positive input port, and a second reference voltage VH through a negative input port. The first comparator 22 compares the voltage P2 with a second reference voltage VH, and outputs a first compare signal P3. If the voltage P2 across capacitor C is larger than the second reference voltage VH, the first compare signal P3 has a 'high' level. On the other hand, if the voltage P2 is smaller than the second reference voltage VH, the first compare signal P3 has a low level. The second reference voltage VH is preferably set to a value close to the maximum value of the dynamic range of the control voltage VC.

A second comparator 26 receives voltage P2 through a positive input port, and a third reference voltage VL through a negative input port. The first comparator 26 compares the voltage P2 with the third reference voltage VL, and outputs a second compare signal P4. If the voltage P2 is larger than the third reference voltage VL, the second compare signal P4 has a 'high' level. On the other hand, if the voltage P2 is smaller than the third reference voltage VL, the second compare signal P4 has a 'low' level. The third reference voltage VL is preferably set to a value close to the minimum value of the dynamic range of the control voltage VC.

A first delay circuit 24 receives the first compare signal P3, delays the received first compare signal P3 for a predetermined time, and outputs the delayed signal as the first switch control signal P7 to the switch SW1. A second delay circuit 28 receives the second compare signal P4, delays the received second compare signal P4 for a predetermined time, and outputs the delayed signal. An inverter 30 receives and inverts the output signal of the second delay 28, and outputs the inverted signal as the second switch control signal P8 to the switch SW1. In the present embodiment, the delay time of the first delay circuit 24 is the same as that of the second delay circuit 28. However, in other embodiments of the present invention, these delay times may be different.

An up/down counter 32 receives the first and second compare signals P3 and P4. Whenever the first compare signal P3 changes from low to high, the up/down counter 32 decreases its count by 1. Whenever the second compare signal P4 changes from high to low, the up/down counter 32 decreases its count by 1. In the present embodiment, the up/down counter 32 is comprised of 2 bits and outputs counted values in parallel. However, the up/down counter 32 can have a different number of bits. For example, the up/down counter 32 could have any number of bits from 3 bits up to 16 bits or more.

An offset current source 34 generates a current varying with the output value of the up/down counter 32, and outputs the current as an offset current $I_{offset}$. In the present embodiment, the offset current source 34 is comprised of first and second unit current sources 36 and 38, two switches SW2 and SW3, and an adder 40.

The first and second unit current sources 36 and 38 generate first and second reference currents IS1 and IS2, respectively. Preferably, the second reference current IS2 is twice the magnitude of the first reference current IS1, although the offset current source could also be designed with the first and second reference currents IS1 and IS2 having different values or being equal to each other. The first and second unit current sources 36 and 38 can be constructed with a current mirror, using techniques well know in the art, and their design will not be described in detail.

The switch SW2 has one port connected to the output of the first unit current source 36, and the other port connected to the input port of the adder 40. The switch SW2 is turned on or off in response to the lower bit of the two output bits of the up/down counter 32. Accordingly, when the lower bit of the up/down counter 32 is '0', switch SW2 is opened and a zero current is supplied to the input port of the adder 40. When the lower bit of the up/down counter 32 is '1', switch SW2 is closed and the first reference current IS1 is supplied to the input port of the adder 40.

The switch SW3 has one port connected to the output of the second unit current source 38, and the other port connected to the second input port of the adder 40. The switch SW3 is turned on or off in response to the upper bit of the two output bits of the up/down counter 32. Accordingly, when the upper bit of the up/down counter 32 is '0' switch SW3 is closed and zero current is supplied to the second input port of the adder 40. When the upper bit of the up/down counter 32 is '1'. switch SW3 is opened and the second reference current IS2 is supplied to the second input port of the adder 40.

The adder 40 adds the currents from switches SW2 and SW3, and outputs the added current as the offset current $I_{offset}$.

Figure 5:
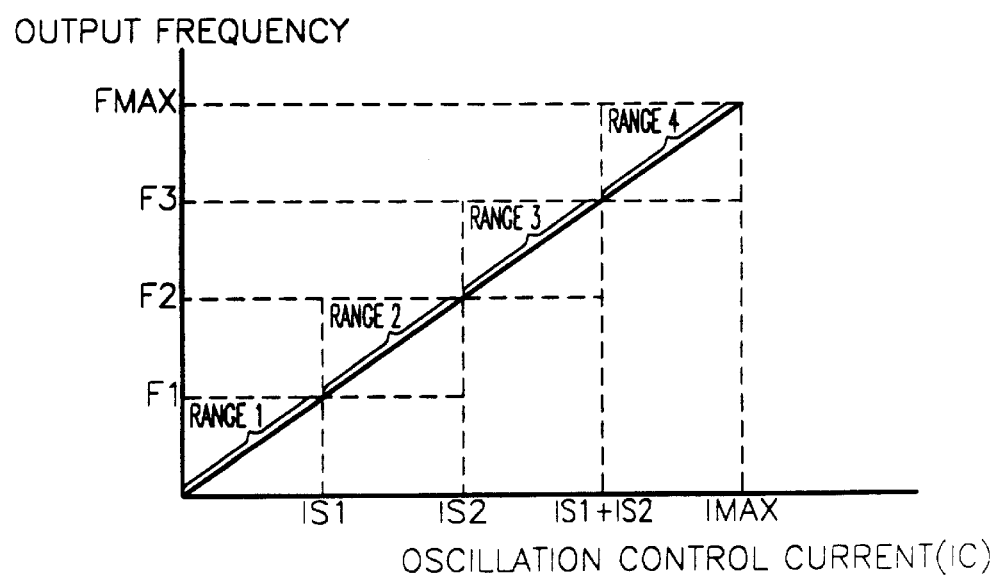
FIG. 5 is a graph illustrating the operating ranges of the oscillators of FIGS. 2 and 3 according to an oscillation control current.

FIGS. 4A through 4H show waveforms of signals indicated in FIG. 3, and FIG. 5 is a graph illustrating the operating ranges of the oscillator 16 over the range of oscillation control current IC. The operation of the voltage controlled oscillator of FIG. 3 will now be described in more detail referring to FIGS. 4A through 4H and FIG. 5.

When a phase locked loop starts operating, assume that input and output voltages P1 and P2 of the buffer 20 are zero volts. Because the comparators 22 and 26 have a negative input port voltage larger than a positive input port voltage, both of them output 'low' level compare signals P3 and P4. Thus, the first and second switch control signals P7 and P8 are 'low' level and 'high' level, respectively. The switch SWI is closed in response to the 'high' level second switch control signal P8, and the voltage P1 input to the buffer 20 becomes the first reference voltage VM, whose magnitude is approximately midway between the second and third reference voltages VH and VL.

When the first reference voltage VM is applied to the buffer 20, capacitor C starts to be charged, and the voltage difference P2 across capacitor C starts increasing from zero. When the voltage difference P2 across capacitor C becomes equal to the third reference voltage VL, the second compare signal P4 output by the second comparator 26 changes to a 'high' level (at a time t1 in FIG. 4). After delay time dT of the delay 28, the second switch control signal P8 is switched to a 'low' level (at time t2 in FIG. 4). Because the first and second switch control signals P7 and P8 are now both 'low' level, the switch SW1 is opened.

Meanwhile, the up/down counter 32 maintains an output value of '00', and the offset amount source 34 does not provide the offset current $I_{offset}$. Because switch SW1 is open and the offset current $I_{offset}$ is zero, the voltage controlled oscillator operates as if the offset current generator 12 does not exist. That is, the control voltage VC input is converted into control current IV by the voltage-to-current converter 10, the oscillation control current IC output from adder 14 is equal to control current IV, and the oscillator 16 generates an oscillation signal whose frequency varies according to the oscillation control current IC. Thus, the oscillator 16 operates within range 1 shown in FIG. 5.

If the control voltage VC exceeds the second reference voltage VH, the voltage difference P2 across capacitor C becomes larger than the second reference voltage VH, and the first compare signal P3 changes to 'high' (at time t3 in FIG. 4). After delay time dT of the delay 24, the first switch control signal P7 changes to a 'high' level (at time t4 in FIG. 4). The switch SW1 closes in response to the first switch control signal P7 'high' level, and the first reference voltage VM is applied to the buffer 20.

When the first compare signal P3 changes to 'high' at time t3, the up/down counter 32 increases its count by 1. Accordingly, the lower bit BIT0 up/down counter 32 output is '1' and the upper bit BIT1 is '0'. When the lower bit BIT0 of the counter 32 is switched to '1', the switch SW2 closes and allows the first reference current IS1 from the first unit current source 36 to be supplied as an offset current $I_{offset}$ to the adder 14 via switch SW2 and the adder 40.

After switch SW1 closes at time t4, and the first reference voltage VM is thus applied to buffer 20, capacitor C starts to discharge. When the voltage difference P2 across capacitor C is less than the second reference voltage VH, the first compare signal P3 is switched back to 'low' (at time t5 in FIG. 4). After delay time dT of the delay 24, the first switch control signal P7 is switched to 'low' level (at time t6 in FIG. 4). Since the first and second switch control signals P7 and P8 are now both 'low' level, switch SW1 opens.

At this time, the control voltage VC is converted into the control current IV by the voltage-to-current converter 10. The adder 14 adds the offset current $I_{offset}$ (equal to the first reference current IS1) to the control current IV to generate the oscillation control current IC. The oscillator 16 generates an oscillation signal having a frequency varying according to the oscillation control current IC. Thus, the oscillator 16 operates within range 2 shown in FIG. 5.

If the control voltage VC again exceeds the second reference voltage VH, the voltage difference P2 across capacitor C becomes larger than the second reference voltage VH. At this time, the first compare signal P3 changes to 'high' (at time t7 in FIG. 4). Thereafter, the delay time dT of the delay 24 elapses, the first switch control signal P7 is switched to 'high' level (at time t8 in FIG. 4). The switch SW1 closes in response to the first switch control signal P7 in 'high' level, and the first reference voltage VM is applied to the input of buffer 20.

When the first compare signal P3 changes to 'high' at time t7, the up/down counter 32 increases its count by 1. Accordingly, the lower bit BIT0 of the up/down counter 32 output is '0' and the upper bit BIT1 is '1', and switch SW2 is opened while switch SW3 is closed. Thus, the second reference current IS2 from the second unit current source 38 is supplied as an offset current $I_{offset}$ to the adder 14 via switch SW3 and adder 40.

After the switch SW1 closes at time t8 and the first reference voltage VM is thus applied to buffer 20, when the voltage difference P2 across capacitor C is less than the second reference voltage VH. the first compare signal P3 is switched back to 'low' (at time t9 in FIG. 4). After delay time dT of the delay 24, the first switch control signal P7 is switched to 'low' level (at time t10 in FIG. 4). Since the first and second switch control signals P7 and P8 are both 'low' again, the switch SW1 is opened.

At this time, the control voltage VC input is converted into the control current IV by the voltage-to-current converter 10. The adder 14 adds the offset current $I_{offset}$ (equal to the second reference current IS2) to the control current IV, to generate the oscillation control current IC. The oscillator 16 generates an oscillation signal having a frequency which varies according to the oscillation control current IC. Thus, the oscillator 16 operates within range 3 shown in FIG. 5.

If the control voltage VC once again exceeds the second reference voltage VH, the up/down counter 32 again increases its count by 1 in the same way as described above. Accordingly, both the lower bit BIT0 and the upper bit BIT1 of the up/down counter 32 output are '1'. Thus, switches SW2 and SW3 are closed, such that the first and second reference currents IS1 and IS2 are summed by adder 40, and the sum is supplied as offset current $I_{offset}$ to the adder 14. Thus, the oscillator 16 operates within range 4 shown in FIG. 5.

The operation of the voltage controlled oscillator when the control voltage VC is decreasing will now be described. Assume that the control voltage VC decreases after time t10. At this time, capacitor C starts discharging, and thus the voltage difference P2 across capacitor C is reduced. When voltage P2 across capacitor C is less than the third reference voltage VL, the second compare signal P4 changes to 'low' (at time t11 in FIG. 4). After delay time dT of the delay 28, the second switch control signal P8 is switched to a 'high' level (at time t12 in FIG. 4). The switch SW1 is turned on in response to the second switch control signal P8 high level, and the first reference voltage VM is applied to buffer 20.

When the second compare signal P4 changes to 'low' at time t11, the up/down counter 32 decreases its count by 1. Accordingly, the lower bit BIT0 of up/down counter 32 output is '1' and the upper bit BIT1 is '0'. The switch SW2 is closed and the switch SW3 is opened. Thus, the first reference current IS1 is supplied as an offset current $I_{offset}$ to the adder 14 via switch SW2 and adder 40.

After switch SW1 is closed at time t12 and the first reference voltage VM is thus applied to buffer 20, capacitor C starts charging. When the voltage difference P2 across capacitor C exceeds the third reference voltage VL, the second compare signal P4 is switched back to 'high' (at time t13 in FIG. 4). After delay time dT of the delay 28, the second switch control signal P8 is switched to 'low' level (at time t14 in FIG. 4). Since both the first and second switch control signals P7 and P8 are 'low' again, the switch SW1 opens.

At this time, the adder 14 adds the offset current $I_{offset}$ (equal to the first reference current IS1) to the control current IV to generate the oscillation control current IC. The oscillator 16 generates an oscillation signal having a frequency which varies according to the oscillation control current IC. Thus, the oscillator 16 again operates within range 1 as shown in FIG. 5.

From the above description, it can be seen that when the control voltage VC increases above the second reference voltage VH, the up/down counter 32 increases its count, and offset current $I_{offset}$ and thus the oscillation control current IC are increased by a step amount. The step amount will be equal to IS1 or IS2-IS1 (which equals IS1 in the preferred embodiment), depending on which range the voltage controlled oscillator is operating in. Similarly, when the control voltage VC drops below the third reference voltage VL, the up/down counter 32 decreases its count, and offset current $I_{offset}$ and oscillation control current IC are decreased by a step amount. Thus, the voltage controlled oscillator of FIG. 3 operates in discrete ranges as shown in FIG. 5. This results in a design in which the control voltage VC varies within a narrow range but the resulting oscillation control current IC (and thus the oscillation signal generated by oscillator 16) can vary over a much wider range.

In the above-described voltage controlled oscillator of the present invention, the gain of the voltage controlled oscillator is the sum of the gain of the voltage-to-current converter 10 and the oscillator 16. This gain may be expressed by the following Equation 1:

$$Gain_{(VCO)} = Gain_{(I/V)} \cdot Gain_{(OSC)}$$
$$= \frac{I}{V} \cdot \frac{F}{I}$$
$$= \frac{FMAX}{4(VH - VL)},$$

wherein $Gain_{(I/V)}$ and $Gain_{(OSC)}$ are, respectively, the gains of the voltage-to-current converter 10 and the oscillator 16, VH and VL are, respectively, the maximum and minimum input voltages to the voltage controlled oscillator, and FMAX denotes the maximum frequency at which the voltage controlled oscillator can oscillate. The gain of a conventional oscillator having the same oscillation frequency range is $$\frac{FMAX}{(VH \cdot VL)}.$$

Thus, the voltage controlled oscillator of the present invention has a gain that is only a quarter of the gain of a conventional oscillator. This low gain improves the jitter performance of the voltage controlled oscillator.

In the present embodiment, the operating range of the oscillator 16 is classified into four subranges by using a 2-bit counter as shown in FIG. 5. However, in other embodiments of the present invention, the operating range of the oscillator 16 can be divided into a greater number of subranges than 4 by using a counter having more than 2 bits. In these alternative embodiments, the number of unit current sources may be increased in proportion to the number of counter bits. For example, the voltage controlled oscillator could be constructed having an up/down counter with any number of bits from 3 bits up to 16 bits or more, and a corresponding number of unit current sources. A voltage controlled oscillator having an up/down counter with 3 bits and having 3 unit current sources would have 8 subranges. As the number of subranges is increased, the gain of the voltage controlled oscillator is correspondingly reduced.

As noted above, the voltage controlled oscillator of the present invention may be used in place of conventional voltage controlled oscillator 6 in a phase locked loop such as that shown in FIG. 1. Because the voltage controlled oscillator of the present invention can produce a stable oscillation signal over a wide frequency range, a phase locked loop utilizing such a voltage controlled oscillator will produce an oscillation signal that closely tracks the input reference signal while having a wide frequency range.

The above description is only an example of one embodiment of the present invention, and the invention is not limited to this description and can be modified in various ways. For example, in a phase locked loop having a charge pump between the filter and the voltage controlled oscillator, the input signal to the voltage controlled oscillator is not a voltage but a pump current. In this design the voltage-to-current converter 10 would be omitted from the voltage controlled oscillator of FIG. 3, and the buffer 20 replaced with a transfer conductance amplifier or a current-to-voltage converter.

Thus, a method and apparatus for generating a stable oscillation signal over a wide frequency range, and a phase locked loop using such an apparatus or method, has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A voltage controlled oscillator that generates an oscillation signal in response to a control voltage, the voltage controlled oscillator comprising:

a voltage-to-current conversion unit for converting the control voltage into a control current;

a switch that selects either the control voltage or a first reference voltage and generates a selected voltage;

a generator that generates a first signal responsive to the selected voltage, and an offset current responsive to the selected voltage;

an adding unit for adding the control current to the offset current and generating an oscillation control current; and an oscillation unit for generating the oscillation signal having a frequency varying with the oscillation control current, wherein the switch is controlled by the first signal.

2. The voltage controlled oscillator of claim 1, wherein generator increases the offset current when the control voltage is greater than a first predetermined value and decreases the offset current when the control voltage is less than a second predetermined value.

3. The voltage controlled oscillator of claim 2, wherein the offset current is increased by a step amount and decreased by a step amount.

4. The voltage controlled oscillator of claim 2, further including a first comparator to determine when the control voltage is greater than the first predetermined value, and a second comparator to determine when the control voltage is less than the second predetermined value.

5. A voltage controlled oscillator that generates an oscillation signal in response to a control voltage, the voltage controlled oscillator comprising:
   a voltage-to-current conversion unit for converting the control voltage into a control current;
   an offset current generation unit for generating an offset current varying in response to changes in the control voltage;
   an adding unit for adding the control current to the offset current and generating an oscillation control current; and
   an oscillation unit for generating the oscillation signal having a frequency varying with the oscillation control current, wherein the offset current generation unit is responsive to a first reference voltage when the control voltage is greater than a first predetermined value for a first predetermined time and when the control voltage is less than a second predetermined value for a second predetermined time.

6. A voltage controlled oscillator that generates an oscillation signal in response to a control voltage, the voltage controlled oscillator comprising:
   a voltage-to-current conversion unit for converting the control voltage into a control current;
   an offset current generation unit for generating an offset current varying in response to changes in the control voltage;
   an adding unit for adding the control current to the offset current and generating an oscillation control current; and
   an oscillation unit for generating the oscillation signal having a frequency varying with the oscillation control current, wherein the offset current generation unit comprises:
   a switch for selecting either the control voltage or a first reference voltage and generating a selected voltage;
   a first comparator for comparing the selected voltage and a second reference voltage to generate a first compare signal;
   a second comparator for comparing the selected voltage and a third reference voltage to generate a second compare signal;
   a counter for receiving the first and second compare signals, the counter increasing its count in response to the first compare signal and decreasing its count in response to the second compare signal; and
   an offset current source for generating a current varying in response to the count of the counter, and generating the current as the offset current.

7. The voltage controlled oscillator of claim 6, wherein the switch selects in response to the first and second compare signals.

8. The voltage controlled oscillator of claim 6, wherein the offset current generation unit further comprises a buffer for receiving the selected voltage and buffering the selected voltage before input to the first and second comparators.

9. The voltage controlled oscillator of claim 8, wherein the offset current generation unit further comprises a capacitor having one port connected to the output of the buffer and a second port grounded.

10. The voltage controlled oscillator of claim 6, wherein the offset current generation unit further comprises:
    a first delay for receiving the first compare signal and generating a first switch signal after a first predetermined time; and
    a second delay for receiving the second compare signal and generating a second switch signal after a second predetermined time; wherein the switch operates in response to the first and second switch signals.

11. The voltage controlled oscillator of claim 6, wherein the offset current source comprises:
    a unit current source for generating a reference current; and
    a current source switch connected between the unit current source and the adding unit, the current source switch being turned on or off in response to the count of the counter.

12. A voltage controlled oscillator that generates an oscillation signal, the voltage controlled oscillator comprising:
    a switch that selects either a control voltage or a first reference voltage and generates a selected voltage;
    a generator that generates a first signal responsive to the selected voltage, and an offset current varying in increments responsive to the selected voltage, and a first signal responsive to the selected voltage;
    an adding unit for adding the offset current to another current and generating an oscillation control current; and
    an oscillation unit for generating the oscillation signal having a frequency varying with the oscillation control current,
    wherein the switch is controlled by the first signal.

13. A phase locked loop comprising:
    a phase detector for detecting a phase difference between an input reference signal and an oscillation signal, and generating a phase difference signal;
    a filter for filtering the phase difference signal and generating a control voltage; and
    a voltage controlled oscillator for generating an oscillation signal whose frequency varies with the control voltage, the voltage controlled oscillator comprising:
    a voltage-to-current conversion unit for converting the control voltage into a control current;
    a switch that selects either the control voltage or a first reference voltage and generates a selected voltage;
    a generator that generates a first signal responsive to the selected voltage, and an offset current responsive to the selected voltage;
    an adding unit for adding the control current to the offset current and generating an oscillation control current; and
    an oscillation unit for generating the oscillation signal having a frequency varying with the oscillation control currents wherein the switch is controlled by the first signal.

14. The phase locked loop of claim 13, wherein the generator increases the offset current when the control voltage is greater than a first predetermined value and decreases the offset current when the control voltage is less than a second predetermined value.

15. The phase locked loop of claim 14, wherein the offset current is increased by a step amount and decreased by a step amount.

16. The phase locked loop of claim 14, further including a first comparator to determine when the control voltage is greater than the first predetermined value, and a second comparator to determine when the control voltage is less than the second predetermined value.

17. A phase locked loop comprising:
- a phase detector for detecting a phase difference between an input reference signal and an oscillation signal, and generating a phase difference signal;
- a filter for filtering the phase difference signal and generating a control voltage; and
- a voltage controlled oscillator for generating an oscillation signal whose frequency varies with the control voltage, the voltage controlled oscillator comprising:
  - a voltage-to-current conversion unit for converting the control voltage into a control current;
  - an offset current generation unit for generating an offset current varying in response to changes in the control voltage;
  - an adding unit for adding the control current to the offset current and generating an oscillation control current; and
  - an oscillation unit for generating the oscillation signal having a frequency varying with the oscillation control current, wherein the offset current generation unit is responsive to a first reference voltage when the control voltage is greater than a first predetermined value for a first predetermined time and when the control voltage is less than a second predetermined value for a second predetermined time.

18. A phase locked loop comprising:
- a phase detector for detecting a phase difference between an input reference s and an oscillation signal, and generating a phase difference signal;
- a filter for filtering the phase difference signal and generating a control voltage; and
- a voltage controlled oscillator for generating an oscillation signal whose frequency varies with the control voltage, the voltage controlled oscillator comprising:
  - a voltage-to-current conversion unit for converting the control voltage into a control current;
  - an offset current generation unit for generating an offset current varying in response to changes in the control voltage;
  - an adding unit for adding the control current to the offset current and generating an oscillation control current; and
  - an oscillation unit for generating the oscillation signal having a frequency varying with the oscillation control current, wherein the offset current generation unit comprises:
    - a switch for selecting either the control voltage or a first reference voltage and generating a selected voltage;
    - a first comparator for comparing the selected voltage and a second reference voltage to generate a first compare signal;
    - a second comparator for comparing the selected voltage and a third reference voltage to generate a second compare signal;
    - a counter for receiving the first and second compare signals, the counter increasing its count in response to the first compare signal and decreasing its count in response to the second compare signal; and
    - an offset current source for generating a current varying in response to the count of the counter, and generating the current as the offset current.

19. A method for generating a oscillation signal having a frequency varying in accordance with a control voltage, comprising:
- converting the control voltage into a control current;
- selecting either the control voltage or a first reference voltage and generating a selected voltage;
- generating a first signal responsive to the selected voltage, and an offset current responsive to the selected voltage;
- adding the control current to the offset current to generate an oscillation control current; and
- generating the oscillation signal whose frequency varies according to the oscillation control current,
wherein the selecting is responsive to the first signal.

20. The method of claim 19, wherein the step of generating the offset current comprises increasing the offset current when the control voltage is greater than a first predetermined value and decreasing the offset current when the control voltage is less than a second predetermined value.

* * * * *